(12) United States Patent
Porter et al.

(10) Patent No.: US 6,859,408 B2
(45) Date of Patent: Feb. 22, 2005

(54) CURRENT LIMITING ANTIFUSE PROGRAMMING PATH

(75) Inventors: Stephen R. Porter, Boise, ID (US);
Scott J. Derner, Boise, ID (US)

(73) Assignee: Micron Technology, Inc., Boise, ID (US)

(*) Notice: Subject to any disclaimer, the term of this patent is extended or adjusted under 35 U.S.C. 154(b) by 22 days.

(21) Appl. No.: 10/230,637

(22) Filed: Aug. 29, 2002

(65) Prior Publication Data

US 2004/0042318 A1 Mar. 4, 2004

(51) Int. Cl.$^7$ .................................................. G11C 7/00
(52) U.S. Cl. .............................. 365/225.7; 365/185.14; 365/185.28
(58) Field of Search .................... 365/225.7, 185.14, 365/185.28

(56) References Cited

U.S. PATENT DOCUMENTS

| | | | |
|---|---|---|---|
| 5,898,633 A * | 4/1999 | Caravella et al. ........... 365/226 |
| 6,005,797 A | 12/1999 | Porter et al. ................ 365/156 |
| 6,128,244 A | 10/2000 | Thompson et al. ..... 365/230.03 |
| 6,141,272 A | 10/2000 | Van de Graaff et al. .... 365/201 |
| 6,219,293 B1 | 4/2001 | Butler et al. ................ 365/226 |
| 6,269,023 B1 * | 7/2001 | Derhacobian et al. . 365/185.24 |
| 6,275,409 B1 | 8/2001 | Porter et al. ................ 365/149 |
| 6,297,998 B1 | 10/2001 | Van de Graaff et al. .... 365/201 |
| 6,351,425 B1 | 2/2002 | Porter ..................... 365/225.7 |
| 6,355,508 B1 | 3/2002 | Porter et al. ................ 438/140 |
| 6,365,937 B1 | 4/2002 | Porter et al. ................ 257/355 |
| 6,376,297 B1 | 4/2002 | Porter et al. ................ 438/238 |
| 6,385,098 B2 | 5/2002 | Butler et al. .......... 365/189.09 |
| 6,545,928 B1 * | 4/2003 | Bell ....................... 365/225.7 |

* cited by examiner

Primary Examiner—Richard Elms
Assistant Examiner—Pho M. Luu
(74) Attorney, Agent, or Firm—Fletcher Yoder (57) ABSTRACT

Method and apparatus for regulating an antifuse programming current by lightly doping an electrically connected region so that the resistance of the region responds in a non-linear manner to changes in voltage. In this way a variable resistor or a variably resistive transistor may be created which vary their resistance in response to an applied voltage and which may thereby limit a programming current while not limiting a lesser, reading current to a serially connected antifuse.

30 Claims, 7 Drawing Sheets

CURRENT LIMITING ANTIFUSE PROGRAMMING PATH

BACKGROUND OF THE INVENTION

1. Field of the Invention

This invention relates generally to antifuses used in integrated circuit products and, in particular, to limiting the programming current used in conjunction with such antifuses.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Modern integrated circuit (I/C) manufacturing processes typically consist of numerous fabrications steps and produce chips which are simultaneously smaller and more complex. Each fabrication step introduces a new possibility for error which may render a die unusable. Examples of such errors include wafer imperfections or impurities, particulate or chemical contamination, insufficient etching, misalignment of masks, and scratches. Due to the reduced size and increased complexity of I/C devices, what were once acceptable imperfections may now render an I/C device unusable. Therefore, as the number of fabrication steps increases and the size of the product decreases, the actual yield of usable I/C products, measured as the percentage of faultless products, typically decreases.

In response to these potential decreases in yield, manufacturers have introduced higher levels of redundancy into the I/C devices being fabricated. As a result, a critical imperfection in one portion of the I/C device may be compensated for by a redundant component. Such redundancy increases the number of usable I/C products and therefore serves to increase the total yield. In the field of memory circuits, this redundancy has taken the form of providing extra columns and/or rows of memory cells which can be used to replace defective memory cells. In the event of memory cell defects, these extra columns or rows are activated and effectively replace the malfunctioning elements.

Implementation of this form of redundancy in memory circuits has relied upon structures known as antifuses. Specifically, in implementing memory circuit redundancy, antifuses are used as nonvolatile programmable memory elements which store logic states controlling the activation of redundant memory cell rows and columns. The antifuse functions as an open circuit until programmed. In addition to their functions in implementing memory cell redundancy, antifuses also may be used to change an operating mode or to encode identification information within an integrated circuit.

Structurally, an antifuse typically includes a polysilicon layer which forms the top plate of the antifuse element and which overlies an implanted region in the substrate forming the bottom plate. A dielectric exists between the two plates. The bottom plate of the antifuse element is usually contiguous with and comprises the source of the access transistor for the antifuse cell. When programmed, an antifuse creates a short circuit or low resistance link through the dielectric, thereby enabling the particular redundant row, column, or memory location.

A semiconductor die often contains a plurality of antifuse elements due to their use in programming redundant memory elements as well as their other uses. As dies have been scaled down, the density of memory elements on the die has increased. Ideally, the antifuses would be scaled down at the same rate as the rest of the die to avoid increasing the percentage of the die area devoted to antifuses. However, scaling down the antifuses has not been successful due to physical limitations of the antifuse structure. In particular, as the size of the antifuses has decreased, the programming current has not decreased at the same rate, leading to progressively greater current density. At these increased current densities, the junction of the bottom plate and the underlying substrate breaks down, creating an open circuit rather than the desired short circuit. The present invention may be directed to overcoming, or at least reducing the affects of, one or more of the problems set forth above.

BRIEF DESCRIPTION OF THE DRAWINGS

Certain advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
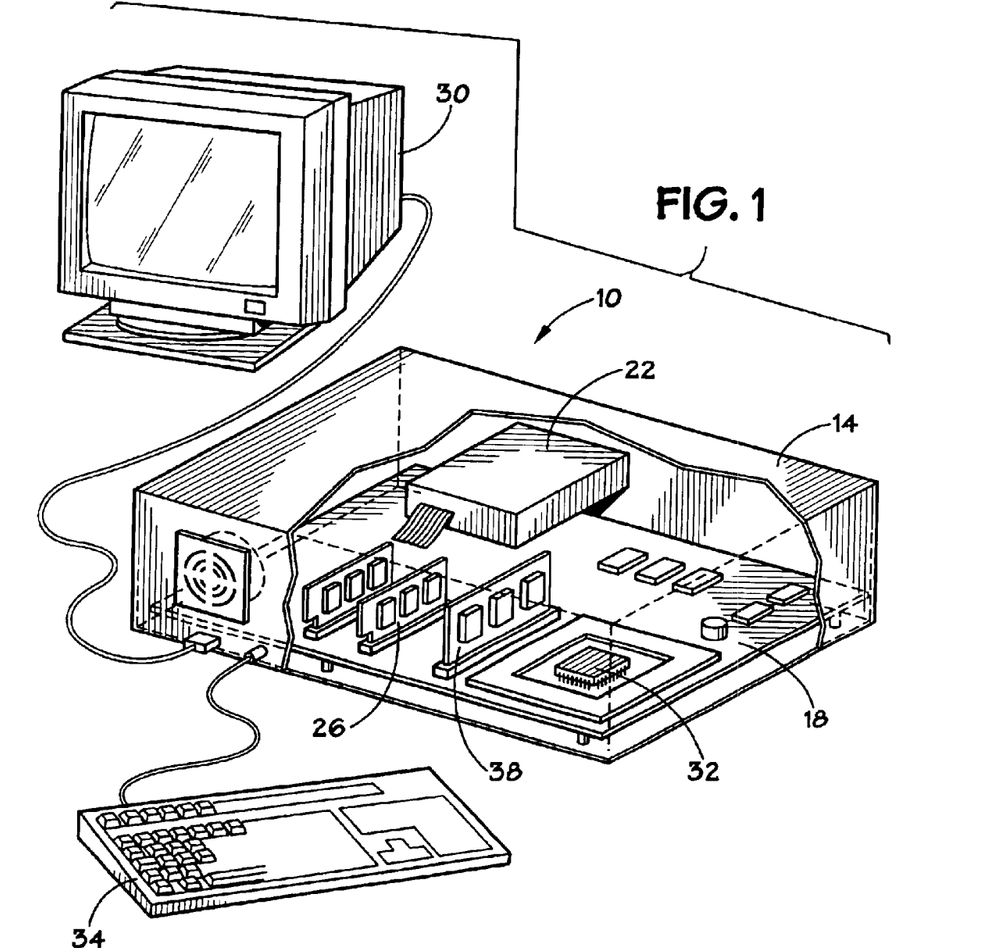
FIG. 1 depicts an exemplary computer system comprising memory elements incorporating a current limited antifuse component.

Turning now to the drawings and referring initially to FIG. 1, there is depicted a cutaway, perspective view of an exemplary computer system 10. The computer system 10 may include a chassis 14, a motherboard 18, one or more mass storage devices 22, one or more memory components 26, and input and output devices such as a monitor 30 and a keyboard 34. The motherboard 18 may include components such as a central processing unit 32 and peripheral cards 38. The computer system 10 may be coupled to a number of other computers or devices via a network, such as a LAN, WAN, SAN, intranet, or the Internet for example, where one or more of the other computers and devices may include similar memory components, such as those described below.

The antifuse circuits associated with the present technique will be described below in the context of a memory chip by way of example. However, it should be understood that the present technique may apply to other types of integrated circuits as well.

Figure 2:
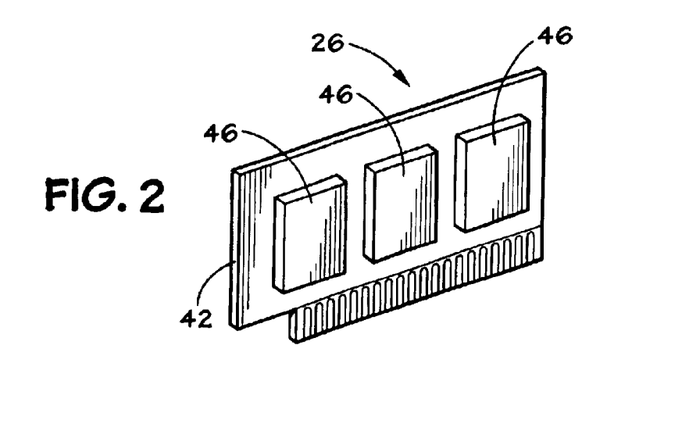
FIG. 2 depicts exemplary memory elements incorporating a current limited antifuse component.

Referring now to FIG. 2, a memory component 26 is depicted as including various memory chips 46 disposed upon a memory card 42. Each memory chip 46 includes a multitude of memory cells arranged in rows and columns. Due to the highly redundant nature of its design, each memory chip 46 also includes numerous redundant memory cells typically arranged in redundant rows and/or columns. When defective memory cells are detected, the rows or columns containing the defective memory cells are deactivated and rows or columns of redundant cells are activated.

The redundant cells are activated by passing a programming current through an associated antifuse. Typically a voltage of 9 V is imposed upon the antifuse, yielding a programming current of between 3–4 mA. Prior to activation, current does not flow through the antifuse. Once programmed however, current may flow through the antifuse and into the circuitry associated with the newly activated memory cells.

Figure 3:
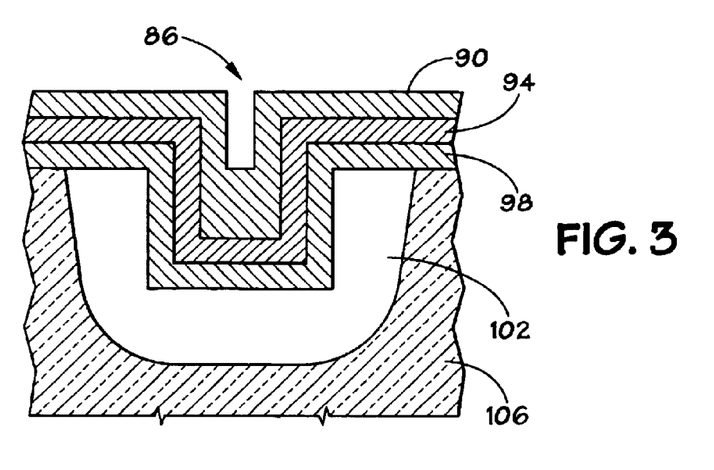
FIG. 3 depicts a cross-section of an antifuse prior to programming as embodied in the present current limiting technique.
Figure 4:
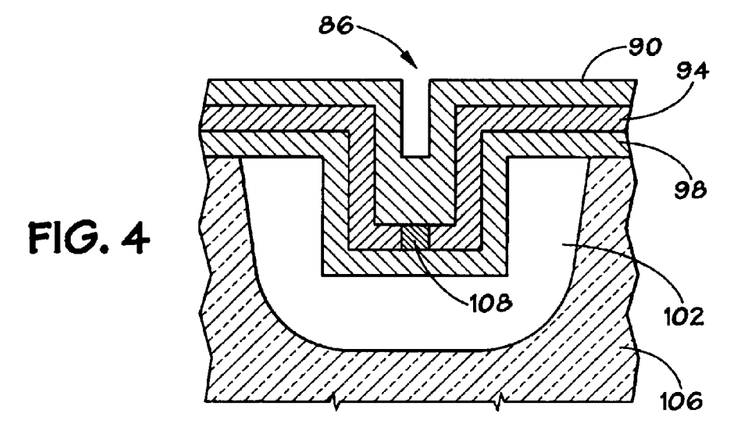
FIG. 4 depicts a cross-section of a programmed antifuse.

A cross-section of an exemplary antifuse 86, as used in the present technique, is depicted in FIG. 3. As depicted, the antifuse 86 comprises a cup-like structure composed of a surface poly N+ layer 90 disposed upon a dielectric layer 94 which in turn is disposed upon a lower poly N+ layer 98. The lower N+ layer 98 is disposed within an N+ implanted region 102 of a P substrate 106. Normally, a programming current is applied so that dielectric layer 94 breaks down at the bottom of the cup, forming a short circuit through the antifuse 86, as depicted in FIG. 4. In this state, a breakdown region 108 of material from the surface poly N+ layer 90 is formed in the dielectric layer 94, allowing the surface poly N+ layer 90 and the lower N+ layer 98 to be electrically connected.

Figure 5:
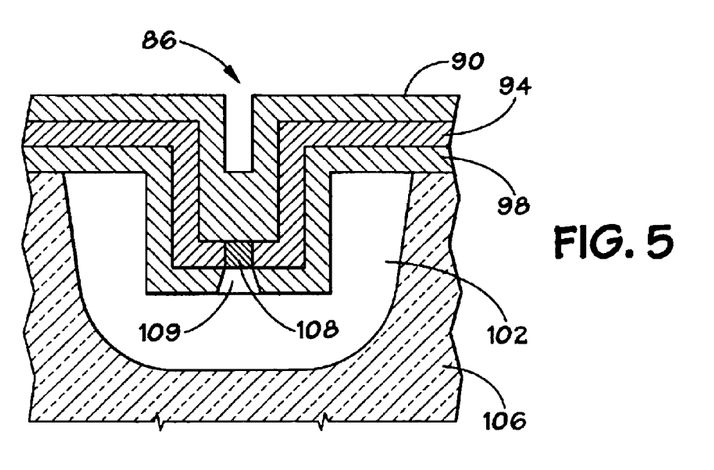
FIG. 5 depicts a cross-section of an inoperative antifuse after exposure to excessive programming current.

However, referring now to FIG. 5, if the programming current is too great, the lower poly N+ layer 98 may damaged, forming a void 109 within the lower layer 98. If such a void 109 is formed, no electrical connection can be made between the surface poly N+ layer 90 and the lower poly N+ layer, rendering the memory cells associated with the antifuse 86 useless. Limiting the programming current, therefore, is desirable. However, subsequent read currents, which are used to query the status of memory cells coupled to the antifuse and which are generally of a much lower amperage, should not be substantially limited.

Presently, programming or read current is applied to an antifuse through a select transistor connected in series with the antifuse. The amount of current applied is a function of the relationship between the voltage imposed upon the transistor system, typically the drain to source voltage ($V_{DS}$), and the resistance of the current path in the transistor. Specifically, the relationship between the current (i), voltage (V), and resistance (r) is given by the function: i=V/r. Since the resistance of a typical transistor is constant, the current and the voltage vary together linearly. Therefore, in order to produce different read and programming currents, existing systems impose a low $V_{DS}$, to generate a low read current, typically 200 µA at 1 V, and a high $V_{DS}$, to generate the greater current necessary to program an antifuse, typically 3–4 mA at 9 V.

Unfortunately, attempts to scale the antifuse structure at the same rate as the memory array has increased the current density as the cross sectional area of the antifuse has decreased. The high current density associated with the existing programming current results in "blown" antifuses where the lower poly N+ layer 98 is voided, as discussed above, rendering the antifuse useless. The incidence of blown antifuses results in lower yields of memory circuits. Alternately, memory circuit manufacturers may choose to not scale the antifuses at the same rate as the memory array. Not scaling antifuses reduces current densities, and therefore increases yields, but at the cost of devoting disproportionate die surface area to redundant systems.

The present technique addresses the problems associated with the scaling of antifuses by introducing a variable resistance component to the antifuse system. In this particular example, a variable resistance component is produced by lightly doping a region through which the current passes. The light doping creates a N– area which is variably resistive in response to an applied voltage. At low voltages, the corresponding resistance may be negligible. At increased voltage, however, a depletion region around the N− area enlarges, progressively increasing the resistance of the N− area. The increased resistance in turn limits the current which may pass through the N− area.

Figure 6:
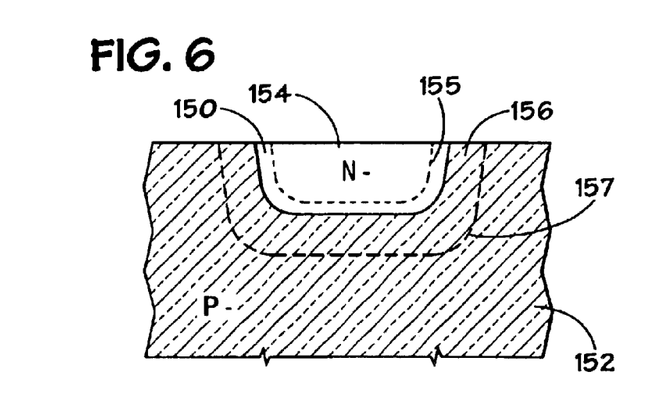
FIG. 6 depicts a cross-section of a lightly doped resistor as embodied in the present current limiting technique.
Figure 6A:
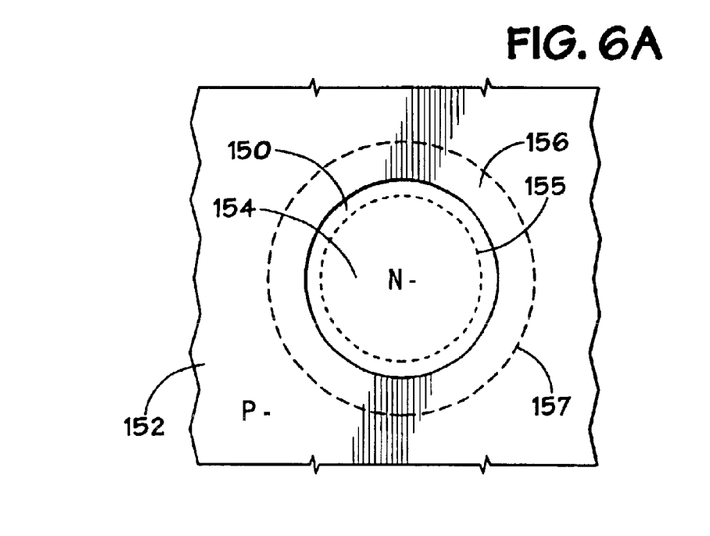
FIG. 6A depicts a top view of a lightly doped resistor as embodied in the present current limiting technique.

An exemplary embodiment of this technique is depicted in FIGS. 6–8. FIG. 6 depicts in cross-section a variable resistor 150 disposed within a P− substrate 152. FIG. 6a depicts the same resistor from a top view. Variable resistor 150 has been lightly doped with approximately $1 \times 10^{13}$ particles of dopant and is N− in character. At 0 V or at a very small voltage, the resistor 150 possesses an effective conductive region 154, here demarcated by a dotted line 155. A depletion region 156, here depicted by the exterior dotted line 157, is also present comprising the region outside of the effective conductive region 154 out to some limit in the substrate 152.

Figure 7:
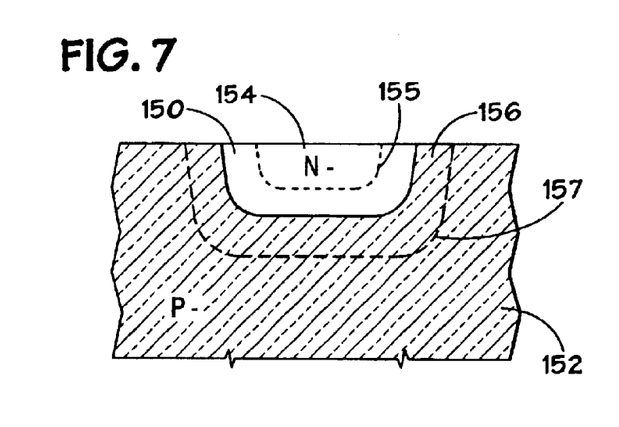
FIG. 7 depicts a cross-section of a lightly doped resistor as embodied in the present current limiting technique with a first voltage bias applied to the resistor.
Figure 7A:
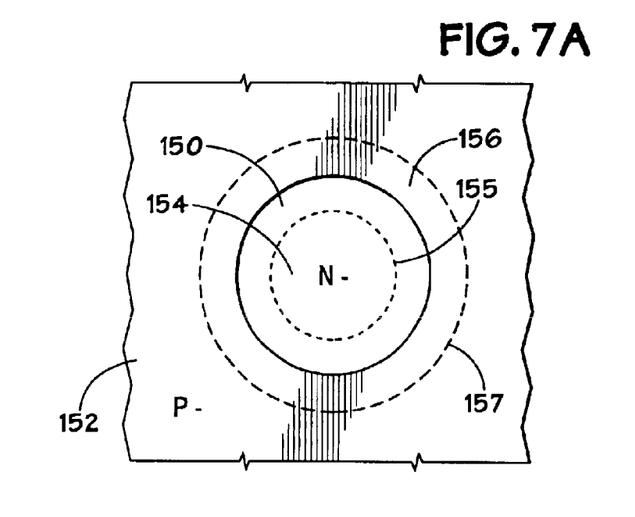
FIG. 7A depicts a top view of a lightly doped resistor as embodied in the present current limiting technique with a first voltage bias applied to the resistor.

FIG. 7 depicts the same resistor 150 with a small voltage bias, e.g. 3V, applied between the variable resistor 150 and the P− substrate 152. FIG. 7A depicts the same resistor 150 from a top view. Application of the small voltage causes the depletion region 156 to enlarge, or conversely, causes the effective conductive region 154 to shrink, thus increasing the resistance.

Figure 8:
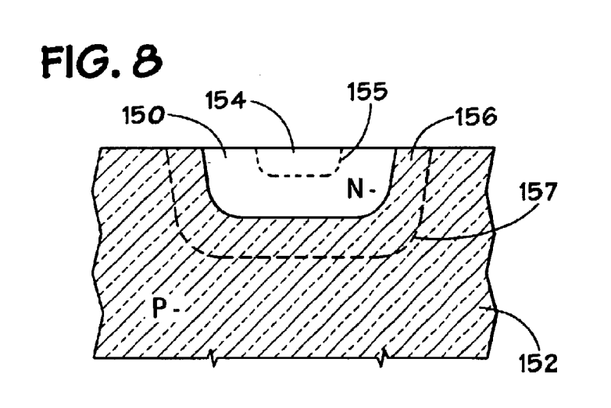
FIG. 8 depicts a cross-section of a lightly doped resistor as embodied in the present current limiting technique with an second voltage bias applied to the resistor.
Figure 8A:
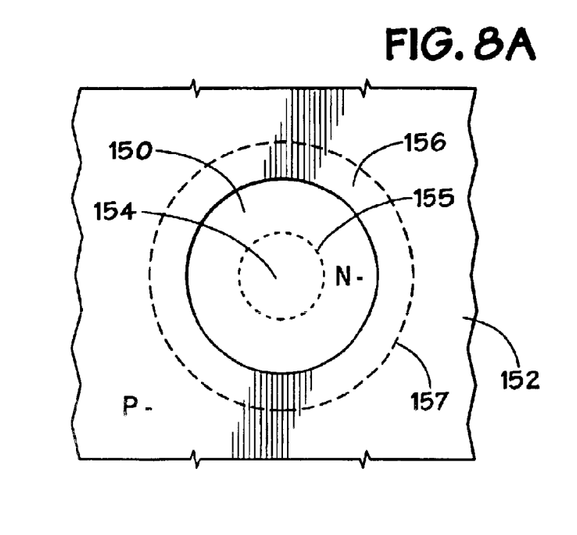
FIG. 8A depicts a top view of a lightly doped resistor as embodied in the present current limiting technique with an second voltage bias applied to the resistor.

FIG. 8 depicts the same resistor 150 with a larger voltage bias, e.g. 8V, applied between the variable resistor 150 and the P− substrate 152. FIG. 8A depicts the same resistor 150 from a top view. Application of the larger voltage causes the depletion region 156 to become further enlarged while effective conductive region 154 is further reduced, thus increasing the resistance even further. As can be seen, since the voltage and resistance both increase, the current does not increase as fast as it would if the resistance stayed the same as the voltage increased.

Figure 9:
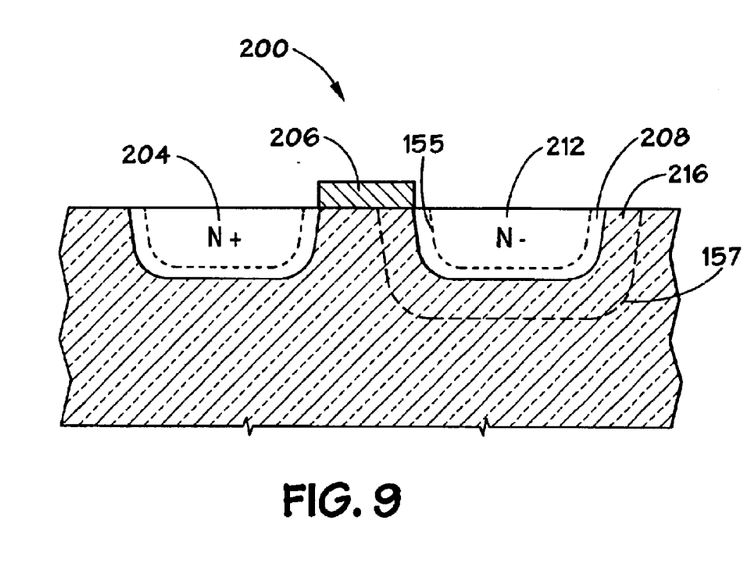
FIG. 9 depicts a cross-section of a transistor as embodied in the present current limiting technique.
Figure 10:
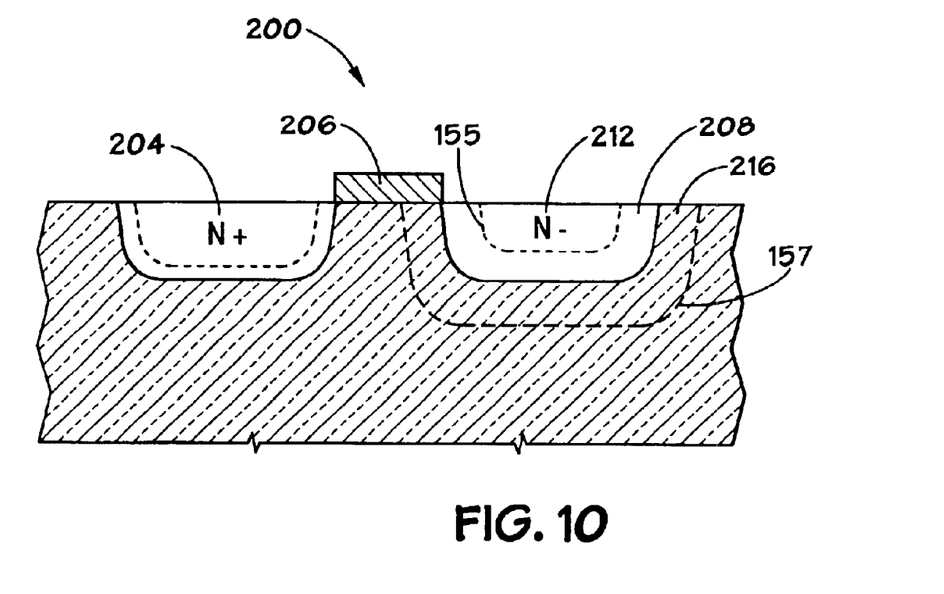
FIG. 10 depicts a cross-section of a transistor as embodied in the present current limiting technique with a first voltage bias applied to the transistor.
Figure 11:
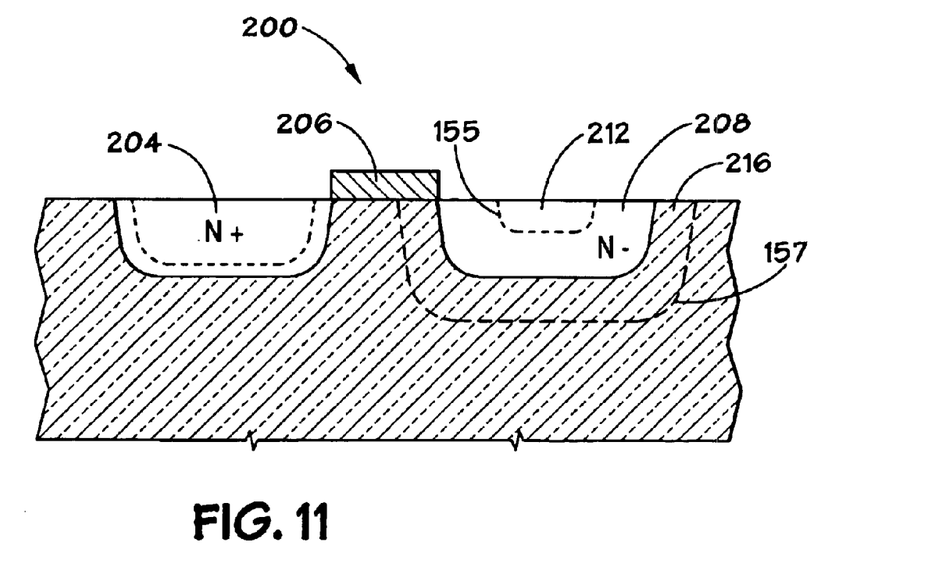
FIG. 11 depicts a cross-section of a transistor as embodied in the present current limiting technique with a second voltage bias applied to the transistor.

Although the present antifuse circuit may include such a variable resistor 150, as explained in greater detail below with respect to FIGS. 16–18, this phenomenon may be applied to transistors, such as a select transistor, as well. FIGS. 9–11 illustrate one example of the present technique embodied in a transistor 200. FIG. 9 depicts a MOSFET transistor 200 having a source 204, a gate 206 and a drain 208. The N+ source 204 is doped with approximately $1 \times 10^{20}$ particles of dopant while the N− drain 208 is relatively lightly doped with approximately $1 \times 10^{13}$ particles of dopant. Due to this light doping, the drain 208 may now be used to limit the source 204. This limiting effect by the drain 208 is depicted in FIGS. 10 and 11. As in the resistor 150, a depletion region 216, demarcated by dotted line 157, is formed around the lightly doped drain 208 in the presence of a voltage, resulting in an increased resistance of the drain 208. Increasing the applied voltage enlarges depletion region 216, thereby reducing the effective conductive region 212, demarcated by dotted line 155, and increasing the resistance. FIG. 10 depicts the reduction of the effective conductive path in the presence of a small voltage, e.g. 3V. FIG. 11 depicts the further reduction of the effective conductive path in the presence of a larger bias, e.g. 8V and, thus, a further increase in resistance.

Figure 12A:
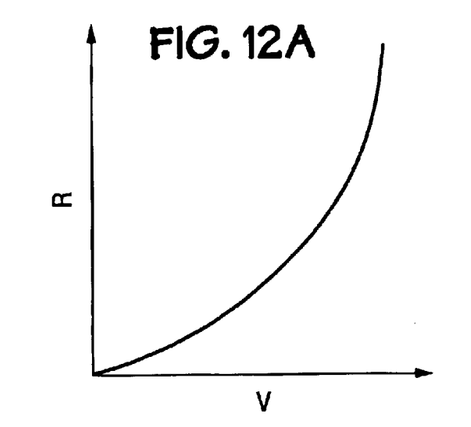
FIG. 12A depicts an R-V curve associated with the present current limiting technique.
Figure 12B:
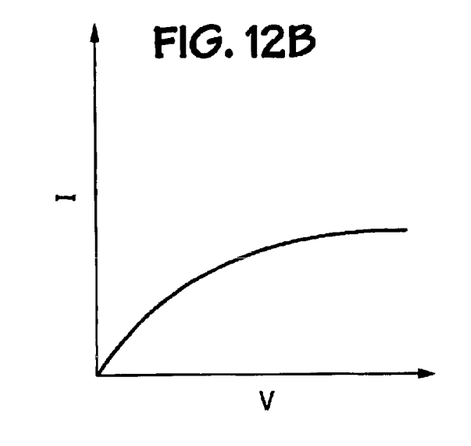
FIG. 12B depicts an I-V curve associated with the present current limiting technique.

FIG. 12A depicts a curve generated by this technique plotting resistance by voltage, and FIG. 12B depicts a curve generated by this technique plotting current by voltage. As can be seen in FIG. 12A, resistance is minimal at low voltages. However, resistance increases in an accelerated, non-linear manner as voltage increases. As the depletion region enlarges, resistance increases disproportionately faster than voltage, approaching an asymptotic threshold. Similarly, as can be seen in FIG. 12B, current increases as voltage increases at low voltages. However, as voltage increases, the rate at which current increases approaches an asymptotic threshold until current is eventually effectively limited by this threshold. Due to the non-linear increase in resistance at increased voltage, current is effectively limited by the virtually unlimited increase in resistance.

This voltage-dependent, current limiting effect may have applications in a wide variety of electrical fields in addition to programming and reading antifuses. In particular, use of these techniques is favored in situations where a variable amount of resistance is desired such that current may be limited in some circumstances but virtually unimpeded in others. However, it is particularly useful for programming antifuses due to the physical limitations, discussed above, which result from scaling antifuses. In regard to scaled antifuses, the programming current may be regulated by controlling the voltage applied to a lightly doped resistor or a transistor having a lightly doped drain or source placed in the antifuse programming path. Conversely, subsequent read currents, which are unlikely to damage the antifuse, may be essentially unimpeded due to the relatively low voltage applied, e.g. 1V, to produce the read current.

Figure 13:
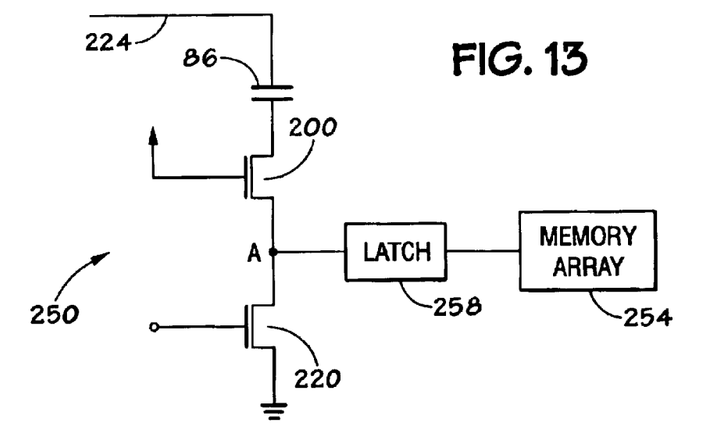
FIG. 13 depicts redundant memory circuit incorporating an unprogrammed antifuse as embodied in the present current limiting technique.

Referring now to FIG. 13, an example of a memory circuit incorporating the present technique is depicted. Specifically, a memory circuit 250 is depicted in which a transistor 200 is placed in series with an antifuse 86. In one embodiment, the gate of the transistor 200 is connected to a voltage supply, such as a variable voltage source or a reference voltage such as $V_{CC}$ (the common collector voltage), or $V_{CCP}$ (the voltage associated with the wordlines of the memory array), such that transistor 200 remains on. In addition, a fuse address (FA) selection transistor 220 and CGND bus 224 each form part of the exemplary memory circuit. The FA selection transistor 220 and the CGND bus 224 have different selectable states which allow the anti fuse 86 to not be selected for programming, to be selected for programming, or to be selected for reading. For example, during normal use, when the primary memory cells are properly functioning, the redundant memory cells in the memory array 254 are not in use and, therefore, the antifuse 86 need not be programmed. In these circumstances, the CGND bus 224 is typically at 0V, or ground, and no current flows through the antifuse 86, which remains an open circuit. Indeed, when the circuit of FIG. 13 is operating normally, i.e., when the latch is checking to see if the antifuse has been programmed, the CGND bus 224 is connected to ground, and the FA selection transistor 220 is off. When the latch circuit 258 reads the state of the antifuse 86, it applies a voltage to node A for short time. If the antifuse 86 has not been programmed, node A will remain high at the applied voltage, and the state of the latch 258 will remain unchanged. Although the particular construction of the latch circuit 258 is not believed to be important for the present technique, the latch assembly 258 typically includes a transistor that controls its connection to node A, as well as two inverters that are connected together as a latch to remember whether the antifuse is programmed.

Figure 14:
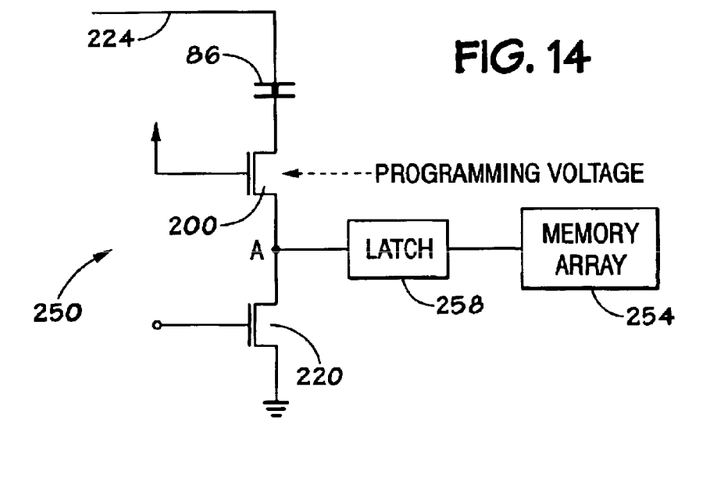
FIG. 14 depicts a redundant memory circuit incorporating a programmed antifuse and an applied high voltage as embodied in the present current limiting technique.

If, however, the redundant memory cells in memory array 254 are to be used, the antifuse 86 is programmed, as depicted in FIG. 14. To program the antifuse 86, the CGND bus 224 is set to a high programming voltage such as 9V and the appropriate FA selection transistor 220 is turned on, typically by setting its voltage to a high logic level such as $V_{cc}$. Activation of the FA selection transistor 220 in this manner connects one plate of the antifuse to ground through the transistors 200 and 220. During antifuse programming, the transistor in the latch circuit 258 is turned off so no current will flow into the latch circuit 258.

One node of the transistor 200 is lightly doped relative to the second node, as described with respect to FIGS. 9–11. When the memory circuit 250 is configured to program the antifuse 86, the lightly doped node (the node coupled to the antifuse 86) serves as the drain of the transistor 200. In the presence of the high programming voltage, as described with respect to FIGS. 9–11, the resistance of the transistor 200 increases and limits the programming current. Limiting the programming current has the effect of also limiting the current density associated with the antifuse 86, thereby preventing the voiding of the antifuse 86. Although the transistor 200 typically has its gate tied to the $V_{CCP}$, the voltage on the gate of the transistor 200 may be varied, allowing a desired amount of current to flow through the transistor 200 during programming and reading of the antifuse 86. The presence of the lightly doped node also increases the breakdown voltage of the active area to the substrate.

Figure 15:
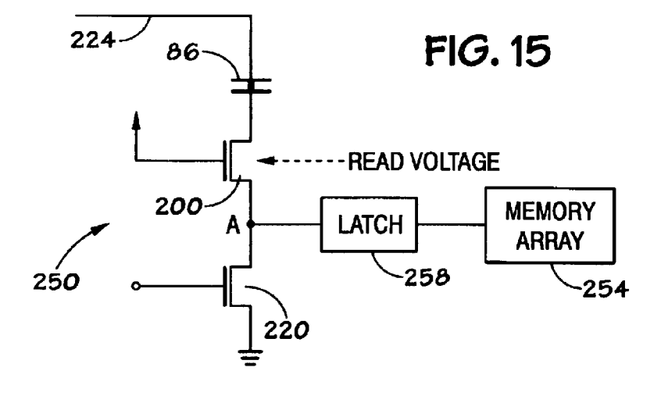
FIG. 15 depicts a redundant memory circuit incorporating a programmed antifuse and an applied low voltage as embodied in the present current limiting technique.

After the antifuse 86 has been programmed, the memory array 254 may be accessed for reading by appropriate configuration of the CGND bus 224 and the FA selection transistor 220, as depicted in FIG. 15. During application of a read current to the memory array 254, the voltage on the CGND bus is typically 0V and an appropriate low logic voltage signal is applied to the FA selection transistor 220, thereby providing access to the latch 258 and the memory array 254. In this manner, the read current is directed into the memory array 254 as opposed to going directly to ground, as occurs during programming. The read currents are typically of substantially lower amperage than the programming current and little or no resistance from the transistor 200 is generally preferred. Therefore, a read voltage, typically a low voltage, is applied to the transistor 200, producing little or no resistance to the reading current. When the memory circuit 250 is configured to read the antifuse 86, the lightly doped node serves as the source of the transistor 200. Therefore, in the described embodiment, the source and drain of the transistor 200 vary depending on the operation being performed upon the antifuse 86.

Figure 16:
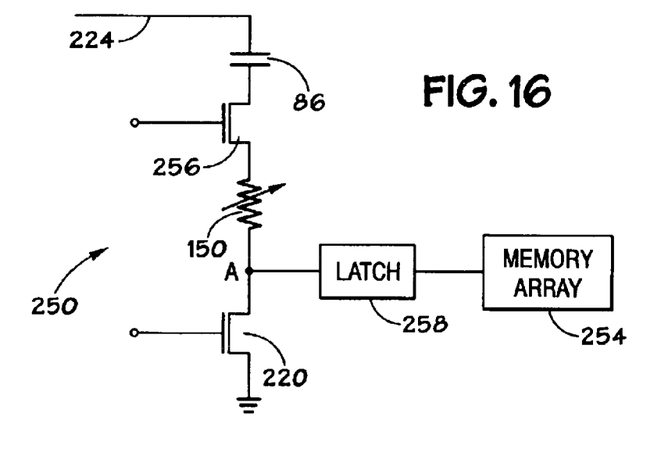
FIG. 16 depicts a redundant memory circuit incorporating an variable resistor as embodied in the present current limiting technique.
Figure 17:
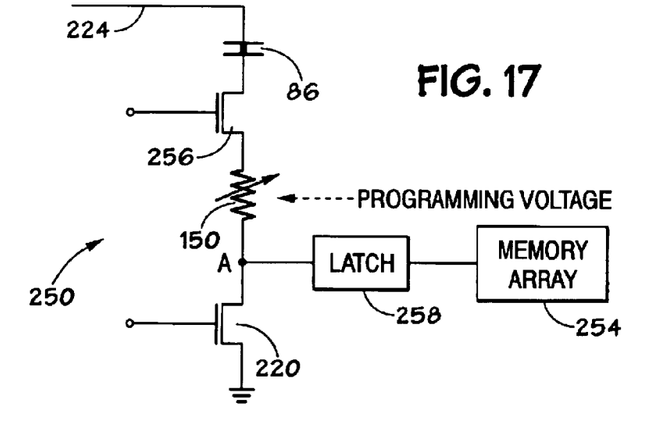
FIG. 17 depicts a redundant memory circuit incorporating a variable resistor and an applied high voltage as embodied in the present current limiting technique.
Figure 18:
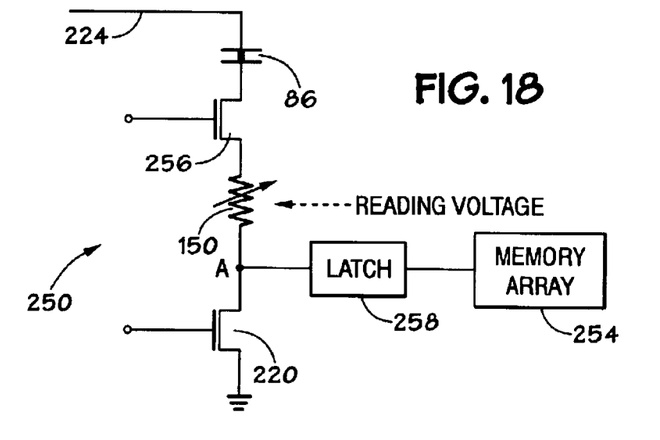
FIG. 18 depicts a redundant memory circuit incorporating a variable resistor and an applied low voltage as embodied in the present current limiting technique.

FIGS. 16–18 depict a similar memory circuit 250 layout but with a conventional select transistor 256 and a variable resistor 150 in place of variable resistance transistor 200. As depicted in FIG. 16, the conventional transistor 256 and the variable resistor 150 are placed in series with the antifuse 86. It should be noted that, because they are connected in series, the variable resistor 150 may be disposed either before or after conventional transistor 256 and still achieve a current limiting effect. As described above and as depicted in FIG. 17, the antifuse 86 is programmed by applying a high programming voltage, such as $V_{cc}$ to the P/R signal line 224 and by turning on the appropriate FA selection transistor 220, typically by setting its voltage to a high logic level such as $V_{cc}$. Activation of the FA selection transistor 220 in this manner connects one plate of the antifuse to ground through the transistor 256 and the variable resistor 150, thereby allowing the programming current to flow to ground. The transistor within latch assembly 258 is turned off during programming to prevent the high programming current from damaging the latch assembly 258 or memory array 254. A high programming voltage is applied to the variable resistor 150 when the antifuse 86 is programmed, thereby limiting the programming current and associated current density and preventing voiding of antifuse 86.

After the antifuse 86 has been programmed, the memory array 254 may be accessed for reading, as depicted in FIG. 18. To read memory array 254, the P/R signal line 224 is typically at 0 V and an appropriate low logic voltage is applied to the FA selection transistor 220 such that subsequent read currents are directed to the memory array 254. Likewise, a lower read voltage is applied to the variable resistor 150, yielding a low resistance by the variable resistor 150 and allowing the lower amperage read currents to reach the memory cell 254.

It should be noted that, although FIGS. 13–18 depict an antifuse as the objective of this current limiting technique, electronic components which would benefit from such a limited current or current density may replace the antifuse within the circuit. Similarly, memory array 254 may in fact be any type of device or circuit placed in series with such a current limited component.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A current limiting circuit comprising:
 a transistor comprising:
  a substrate;
  a source disposed along the substrate;
  a drain disposed along the substrate wherein the drain is lightly doped as compared to the source; and
  a gate disposed between the source and the drain; and
 an antifuse operatively coupled to the transistor.

2. The circuit of claim 1, wherein the drain, as defined during an antifuse programming operation, is lightly doped as compared to the source.

3. The circuit of claim 1, wherein the drain is doped with approximately $1 \times 10^{13}$ particles of dopant and the source is doped with approximately $1 \times 10^{20}$ particles of dopant.

4. The circuit of claim 1, wherein the drain comprises an N− region and the source comprises an N+ region.

5. The circuit of claim 1, wherein the transistor exhibits a variable resistance in response to a voltage.

6. The circuit of claim 5, wherein the variable resistance varies in accordance with a resistance-voltage function such that the resistance increases non-linearly relative to the voltage.

7. The circuit of claim 6, wherein a current flowing through the transistor is limited by the variable resistance in accordance with a current-voltage function such that the current approaches a limit as the voltage increases.

8. The circuit of claim 5, wherein the variable resistance limits a programming current passing into the antifuse.

9. The circuit of claim 8, wherein a programming voltage is approximately 9 volts.

10. The circuit of claim 5, wherein a reading current passing through the transistor is substantially unchanged by the variable resistance.

11. The circuit of claim 10, wherein a read voltage is approximately 1 volt.

12. The circuit of claim 1, wherein a voltage supply is connected to the gate such that the transistor is always on.

13. A current limiting circuit comprising:
 a transistor comprising:
  a sustrate;
  a source disposed alone the substrate;

a drain disposed along the substrate wherein the drain is doped differently than the source, wherein a depletion region forms about the drain such that increasing voltage across the depletion region increases the size of the depletion region; and a gate disposed between the source and the drain; and an antifuse operatively coupled to the transistor.

14. A current limiting circuit comprising:

a resistor, wherein a depletion region forms about the resistor such that increasing voltage across the depletion region increases the size of the depletion region, the resistor comprising:

a substrate; and a lightly doped material disposed within the substrate; and an antifuse operatively coupled to the lightly doped material.

15. The circuit of claim 14, wherein the lightly doped material is doped with approximately $1 \times 10^{13}$ particles of dopant.

16. The circuit of claim 14, wherein the resistor exhibits a variable resistance in response to a voltage.

17. The circuit of claim 16, wherein the variable resistance varies in accordance with a resistance-voltage function such that the resistance increases non-linearly relative to the voltage.

18. The circuit of claim 17, wherein a current flowing through the resistor is limited by the variable resistance in accordance with a current-voltage function such that the current approaches a limit as the voltage increases.

19. The circuit of claim 16, wherein the variable resistance limits a programming current passing into the antifuse.

20. The circuit of claim 19, wherein a programming voltage is approximately 9 volts.

21. The circuit of claim 16, wherein a reading current passing through the resistor is substantially unchanged by the variable resistance.

22. The circuit of claim 21, wherein a read voltage is approximately 1 volt.

23. A method of limiting a current comprising:

forming a variably resistive component by differentially doping a portion of the component;

placing the component within a current path;

varying a resistance associated with the component by applying a voltage across the component; and limiting a current in response to the resistance.

24. The method of claim 23, wherein forming the variably resistive component comprises lightly doping a drain of a transistor differently than a source of the transistor.

25. The method of claim 23, wherein forming the variably resistive component comprises lightly doping a resistor.

26. The method of claim 23, wherein the resistance increases at least as rapidly as the voltage increases.

27. The method of claim 23, wherein the resistance varies with the voltage in accordance with a resistance voltage function.

28. The method of claim 23, wherein the current is limited in accordance with a current-voltage function wherein the current approaches a limit as the voltage increases.

29. A method of limiting a current comprising:

varying a resistance associated with a variably resistive component by applying a voltage across the component, wherein the component is formed by differentially doping a portion of the component and wherein the component is placed within a current path; and limiting a current in response to the resistance.

30. A method of increasing resistance of a component comprising:

forming a variable resistance component such that a resistance increases as a voltage increases;

increasing the resistance of the variable resistance component by applying a programming voltage.

* * * * *

UNITED STATES PATENT AND TRADEMARK OFFICE
CERTIFICATE OF CORRECTION

PATENT NO. : 6,859,408 B2
DATED : February 22, 2005
INVENTOR(S) : Stephen R. Porter et al.

It is certified that error appears in the above-identified patent and that said Letters Patent is hereby corrected as shown below:

Column 8,
Line 3, the following should be inserted:
-- a transistor comprising:
a substrate;
a source disposed along the substrate; --

Signed and Sealed this

Seventh Day of June, 2005

JON W. DUDAS
*Director of the United States Patent and Trademark Office*